(12) United States Patent
Hosaka

(10) Patent No.: US 10,778,192 B2
(45) Date of Patent: Sep. 15, 2020

(54) FILTER COEFFICIENT CALCULATION DEVICE, SIGNAL GENERATION DEVICE INCLUDING THE SAME, FILTER COEFFICIENT CALCULATION METHOD, AND SIGNAL GENERATION METHOD

(71) Applicant: ANRITSU CORPORATION, Kanagawa (JP)

(72) Inventor: Yasuo Hosaka, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 74 days.

(21) Appl. No.: 16/166,738

(22) Filed: Oct. 22, 2018

(65) Prior Publication Data
US 2019/0131957 A1 May 2, 2019

(30) Foreign Application Priority Data
Oct. 30, 2017 (JP) ................................. 2017-209517

(51) Int. Cl.
*H03H 17/06* (2006.01)
*H03H 21/00* (2006.01)
(Continued)

(52) U.S. Cl.
CPC .......... *H03H 17/06* (2013.01); *G06F 17/141* (2013.01); *H03H 17/0294* (2013.01); *H03H 21/0012* (2013.01); *H04B 17/0085* (2013.01); *H04B 17/0087* (2013.01); *H04B 17/3912* (2015.01); *H04L 1/0033* (2013.01)

(58) Field of Classification Search
CPC ............... H03H 17/06; H03H 21/0012; H03H 17/0294; H04B 17/0085
See application file for complete search history.

(56) References Cited

U.S. PATENT DOCUMENTS

| 4,896,285 A * | 1/1990 | Ishikawa ............ H03H 17/0211 |
| | | 708/300 |
| 2012/0051414 A1* | 3/2012 | C V ................... H04L 25/03006 |
| | | 375/227 |

(Continued)

FOREIGN PATENT DOCUMENTS

| JP | 2012-050069 A | 3/2012 |
| JP | 2013-201661 A | 10/2013 |
| JP | 2017-184096 A | 10/2017 |

*Primary Examiner* — Matthew D Sandifer
(74) *Attorney, Agent, or Firm* — Pearne & Gordon LLP

(57) ABSTRACT

A filter coefficient calculation device includes a function unit that has a plurality of functions to be executed by an FIR filter, a function selection unit that selects one or a plurality of functions from among the plurality of functions, and a filter coefficient calculation unit that calculates a filter coefficient in the selected one or plurality of functions, and is configured such that the function unit includes a first transfer function calculation unit, a second transfer function calculation unit, and a third transfer function calculation unit which calculate a transfer function of the FIR filter in the respective functions, and the filter coefficient calculation unit performs inverse Fourier transform on the transfer function in the selected one function or a product of the transfer functions in the plurality of functions to obtain an impulse response of the FIR filter and calculates the impulse response as the filter coefficient.

10 Claims, 6 Drawing Sheets

(51) Int. Cl.
 *H04B 17/00* (2015.01)
 *H03H 17/02* (2006.01)
 *G06F 17/14* (2006.01)
 *H04B 17/391* (2015.01)
 *H04L 1/00* (2006.01)

(56) References Cited

U.S. PATENT DOCUMENTS

2016/0126915 A1* 5/2016 Fukue .................... H03G 5/025
 381/101
2018/0367224 A1* 12/2018 Iwai ................... H04B 17/0085

* cited by examiner

FILTER COEFFICIENT CALCULATION DEVICE, SIGNAL GENERATION DEVICE INCLUDING THE SAME, FILTER COEFFICIENT CALCULATION METHOD, AND SIGNAL GENERATION METHOD

TECHNICAL FIELD

The present invention relates to a filter coefficient calculation device calculating a filter coefficient of a finite impulse response (FIR) filter, a signal generation device including the filter coefficient calculation device, a filter coefficient calculation method, and a signal generation method.

BACKGROUND ART

Finite Impulse Response (FIR) filters have been used in circuits in various fields such as digital communication, sound processing, and image processing. For example, in a field of digital communication, an emphasis optimization device that optimizes a setting value of an emphasis function to be added to an input digital signal is known (see Patent Document 1). Meanwhile, the emphasis function refers to a function of correcting a waveform in order to cancel the amount of deterioration of the waveform because the waveform may deteriorate due to frequency characteristics of a transmission line, a circuit, and the like in high-speed data communication.

The emphasis optimization device disclosed in Patent Document 1 includes inverse characteristic calculation means for calculating an inverse characteristic of an amplitude characteristic of a transmission line, inverse Fourier transform means for performing inverse Fourier transform on the inverse characteristic of the amplitude characteristic of the transmission line to obtain an optimal impulse response, impulse response cutout means for cutting out the number of taps necessary for an emphasis function from the impulse response, and optimal setting value calculation means for converting the cut-out impulse response into a value of an emphasis function to calculate an optimal setting value.

With such a configuration, the emphasis optimization device disclosed in Patent Document 1 can obtain an optimal setting value of an emphasis function without troublesome work.

RELATED ART DOCUMENT

Patent Document

[Patent Document 1] JP-A-2013-201661

DISCLOSURE OF THE INVENTION

Problem that the Invention is to Solve

However, in the emphasis optimization device disclosed in Patent Document 1, it is possible to suitably cope with a case where the number of taps of the FIR filter is approximately 2 and a transmission speed is approximately 25 Gbit/sec, but it is difficult to cope with the demand for an increase in functionality in recent years, and thus there is a desire for improvement.

Specifically, in the emphasis optimization device disclosed in Patent Document 1, it is necessary to perform troublesome processing to calculate a filter coefficient in a case where an ultra high speed digital signal of 30 Gbit/sec is processed, for example, by an FIR filter having 10 taps, and thus it is difficult to calculate a filter coefficient within a practical time.

In addition, there are various functions for performing predetermined processing on an input signal by an FIR filter as disclosed in Patent Document 1 and a device is independent for each function in the related art, and thus there has been a desire to realize a plurality of functions in a switching manner by one FIR filter.

The invention is contrived in view of the above-described situations, and an object thereof is to provide a filter coefficient calculation device capable of calculating a filter coefficient of an FIR filter having a relatively large number of taps at high speed and realizing a plurality of functions, a signal generation device including the filter coefficient calculation device, a filter coefficient calculation method, and a signal generation method.

Means for Solving the Problem

According to an aspect of the invention, there is provided a signal generation device comprising a filter coefficient calculation device, signal generation means for generating a signal for testing a test target device, and a finite impulse response filter which has a plurality of predetermined functions executable by the finite impulse response filter depending on a filter coefficient, for setting a filter coefficient calculated by the filter coefficient calculation device, receiving the signal from the signal generation means, performing one or some functions on the signal, and outputting the signal to the test target device, in which the filter coefficient calculation device comprises a plurality of transfer function calculation means for calculating transfer functions of the finite impulse response filter, each of the plurality of transfer function calculation means corresponds to each of the plurality of predetermined functions of the finite impulse response filter, selection means for selecting one or some of the transfer functions in the plurality of the transfer function calculation means, and the filter coefficient calculation means for performing inverse Fourier transform on the transfer function selected by the selection means or a product of the transfer functions selected by the selection means to obtain an impulse response of the finite impulse response filter as the filter coefficient.

With such a configuration, the signal generation device according to the aspect of the invention can perform inverse Fourier transform on the transfer function in one function selected by the selection means or a product of the transfer functions in the plurality of functions selected by the selection means to obtain the impulse response of the finite impulse response filter, and can calculate the impulse response as the filter coefficient.

That is, the signal generation device according to the aspect of the invention does not require complicated processing to calculate the filter coefficient, and can realize the plurality of functions by one FIR filter.

Therefore, the signal generation device according to the aspect of the invention can calculate the filter coefficient of the FIR filter having a relatively large number of taps at high speed and can realize the plurality of functions.

In the signal generation device according to the aspect of the invention, the function designation means may comprise at least one of an emphasis function unit that adds an emphasis function to the signal generated by the signal generation means, a channel emulator function unit that adds a function of simulating a channel through which the signal passes to the signal output to the test target device, and an intersymbol interference function unit that adds a function of exerting influence of intersymbol interference on the signal output to the test target device.

With such a configuration, the signal generation device according to the aspect of the invention can realize at least one of the emphasis function, the channel emulator function, and the intersymbol interference function by one FIR filter.

In the signal generation device according to the aspect of the invention, the channel emulator function unit may add the function of simulating the channel on the basis of scattering parameters of the test target device.

With such a configuration, the signal generation device according to the aspect of the invention can add the function of simulating the channel on the basis of the scattering parameters of the test target device.

The signal generation device according to the aspect of the invention may further comprise a display device that comprises an operation unit for detecting a selection operation of causing a user to select one or the plurality of functions, in which the operation unit may output a signal indicating one or the plurality of functions selected by the selection operation of the user to the selection means.

With such a configuration, the signal generation device according to the aspect of the invention comprises the display device comprising the operation unit for detecting the selection operation of causing the user to select one or the plurality of functions from among the plurality of functions, and thus it is possible to cause the user to intuitively ascertain that the signal generation device has the plurality of functions and any functions can be synthesized.

In the signal generation device according to the aspect of the invention, the display device may comprise a display unit that displays a setting state of one or the plurality of functions selected by the selection operation of the user.

With such a configuration, the signal generation device according to the aspect of the invention can cause the user to intuitively ascertain the setting state of one or the plurality of functions.

According to another aspect of the invention, there is provided a signal generation method comprising a filter coefficient calculation step for a finite impulse response filter that has a plurality of predetermined functions executable by the finite impulse response filter depending on a filter coefficient, a signal generation step of generating a signal for testing a test target device, a filter coefficient setting step of setting a filter coefficient calculated by the filter coefficient calculation step in the finite impulse response filter, and a signal output step of causing the finite impulse response filter to perform the predetermined function or functions on the signal generated in the signal generation step and outputting the signal to the test target device, in which the filter coefficient calculation step comprises a transfer function calculation step of calculating a plurality of transfer functions, each of the plurality of the transfer functions corresponds to each of the plurality of the predetermined functions of the finite impulse response filter, a selection step of selecting one or some transfer functions in the plurality of the transfer functions, and a filter coefficient calculation step of performing inverse Fourier transform on the transfer function in the function selected in the selection step or a product of the some transfer functions selected in the selection step to obtain an impulse response of the finite impulse response filter as the filter coefficient.

With such a configuration, in the signal generation method according to the aspect of the invention, it is possible to perform inverse Fourier transform on the transfer function in one function selected in the selection step or a product of the transfer functions in the plurality of functions selected in the selection step to obtain the impulse response of the finite impulse response filter, and to calculate the impulse response as the filter coefficient.

That is, in the signal generation method according to the aspect of the invention, complicated processing is not required to calculate the filter coefficient, and it is possible to realize the plurality of functions by one FIR filter.

Therefore, in the signal generation method according to the aspect of the invention, it is possible to calculate the filter coefficient of the FIR filter having a relatively large number of taps at high speed and to realize the plurality of functions.

With such a configuration, the signal generation method according to the aspect of the invention includes the filter coefficient calculation method, and thus it is possible to calculate the filter coefficient of the FIR filter having a relatively large number of taps at high speed and to realize the plurality of functions.

The signal generation method according to the aspect of the invention may further include at least one of an emphasis function step of adding emphasis function to the signal, a channel emulator function step of adding a function of simulating a channel through which the signal passes to the signal output to the test target device, and an intersymbol interference function step of adding a function of exerting influence of intersymbol interference on the signal output to the test target device.

In the signal generation method according to the aspect of the invention, the channel emulator function step may add the function of simulating the channel on the basis of scattering parameters of the test target device.

The signal generation method according to the aspect of the invention may further comprise a display step of detecting a selection operation of causing a user to select one or the plurality of functions to display the detected selection operation, in which a signal indicating one or the plurality of functions selected by the selection operation of the user may be output to the selection step.

In the signal generation method according to the aspect of the invention, the display step may display a setting state of one or the plurality of functions selected by the selection operation of the user.

Advantage of the Invention

The invention can provide a filter coefficient calculation device having an effect of making it possible to calculate a filter coefficient of an FIR filter having a relatively large number of taps at high speed and realize a plurality of functions, a signal generation device comprising the filter coefficient calculation device, a filter coefficient calculation method, and a signal generation method.

BEST MODE FOR CARRYING OUT THE INVENTION

Outline of this Embodiment

First, an outline of a signal generation device in this embodiment will be described with reference to FIGS. 1 and 2.

The signal generation device in this embodiment is a device that includes an FIR filter capable of executing three functions and outputs a test signal to a test target device (DUT).

Figure 1:
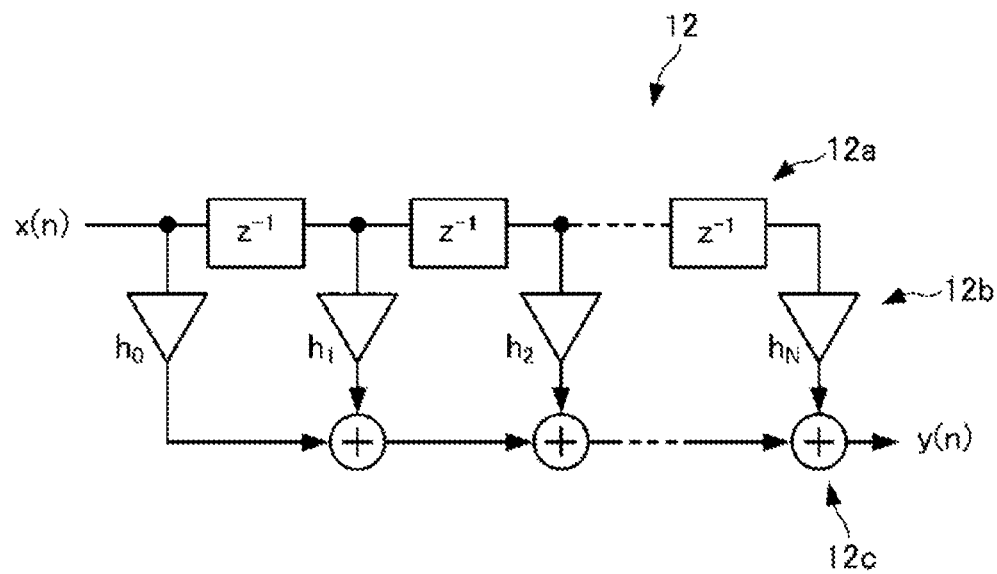
FIG. 1 is a configuration diagram of an FIR filter in an embodiment of the invention.

As illustrated in FIG. 1, an FIR filter 12 included in the signal generation device in this embodiment includes a delay device 12a, a multiplier 12b, and an adder 12c. In the drawing, hN denotes a filter coefficient, and N denotes the number of taps.

In FIG. 1, when an input signal is denoted by x(n), an output signal is denoted by y(n), and an impulse response of the FIR filter 12 is denoted by φ, the impulse response φ is represented by [Expression 1] and the output signal y(n) is represented by [Expression 2]. Meanwhile, n denotes a time, ω denotes a frequency, and a sign * denotes a convolution integral.

$$\varnothing = \sum_{k=0}^{N}(h_k \cdot Z^{-k})$$ [Expression 1]

$$y(n) = \varnothing * x(n) = \sum_{k=0}^{N}(h_k \cdot x(n-k))$$ [Expression 2]

It is assumed that the signal generation device in this embodiment realizes the following three functions by the FIR filter 12 having 10 taps.

(1) Emphasis Function
(2) Channel Emulator Function
(3) ISI (intersymbol interference) Function As described in Background Art, an emphasis function is a function of correcting a waveform in order to cancel the amount of deterioration of the waveform. A channel emulator function is a function of adding a function of simulating a channel through which a signal to be output to a DUT passes to the signal. An Inter Symbol Interference (ISI) function is a function of adding a function of exerting the influence of intersymbol interference on the signal to be output to the DUT.

Figure 2:
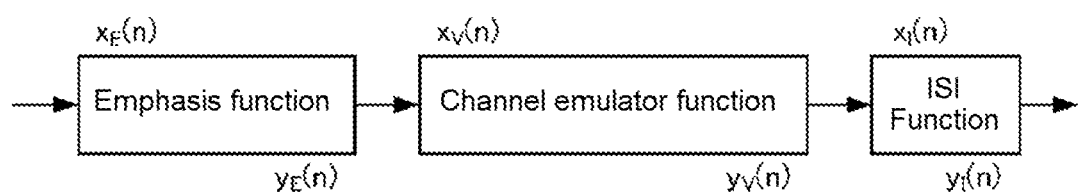
FIG. 2 is a diagram illustrating functions in the embodiment of the invention.

As illustrated in FIG. 2, the signal generation device in this embodiment is configured such that three functions are arranged in series and one or a plurality of functions can be selected from among the three functions. For example, in the signal generation device, the emphasis function is turned on so as to be in a selected state, and the channel emulator function and the ISI function are turned off so as to be in an unselected state. In addition, for example, in the signal generation device, the emphasis function and the ISI function are turned on so as to be in a selected state and synthesized, and the channel emulator function is turned off so as to be in an unselected state. In addition, for example, in the signal generation device, the three functions can also be turned on so as to be in a selected state and synthesized.

(Method of the Related Art)

Here, a case where the above-described three functions are realized by the FIR filter 12 will be described using a method of the related art.

(1) Emphasis Function

When a filter coefficient is set to be hEk, an input signal is set to be xE(n), an output signal is set to be yE(n), and an impulse response is set to be φE in the emphasis function, the impulse response φE is represented by [Expression 3] and the output signal yE(n) is represented by [Expression 4].

$$\varnothing_E = \sum_{k=0}^{N}(h_{Ek} \cdot Z^{-k})$$ [Expression 3]

$$y_E(n) = \varnothing_E * x_E(n) = \sum_{k=0}^{N}(h_{Ek} \cdot x_E(n-k))$$ [Expression 4]

(2) Channel Emulator Function

When a filter coefficient is set to be hVk, an input signal is set to be xV(n), an output signal is set to be yV(n), and an impulse response is set to be φV in the channel emulator function, the impulse response φV is represented by [Expression 5] and the output signal yV(n) is represented by [Expression 6].

$$\varnothing_V = \sum_{k=0}^{N}(h_{Vk} \cdot Z^{-k})$$ [Expression 5]

$$y_V(n) = \varnothing_V * x_V(n) = \sum_{k=0}^{N}(h_{Vk} \cdot x_V(n-k))$$ [Expression 6]

Since xV(n)=yE(n), [Expression 6] is represented by [Expression 7].

$$y_V(n) = \sum_{k=0}^{N}(h_{Vk} \cdot y_E(n-k))$$ [Expression 7]

(3) ISI Function

When a filter coefficient is set to be hIk, an input signal is set to be xI(n), an output signal is set to be yI(n), and an impulse response is set to be φI in the ISI function, the impulse response φI is represented by [Expression 8] and the output signal yI(n) is represented by [Expression 9].

$$\varnothing_I = \sum_{k=0}^{N}(h_{Ik} \cdot Z^{-k})$$ [Expression 8]

$$y_I(n) = \varnothing_I * x_I(n) = \sum_{k=0}^{N}(h_{Ik} \cdot x_I(n-k))$$ [Expression 9]

Since xI(n)=yV(n), [Expression 9] is represented by [Expression 10].

$$y_I(n) = \sum_{k=0}^{N}(h_{Ik} \cdot y_V(n-k))$$ [Expression 10]

When there is an attempt to synthesize the above-described three functions by the FIR filter 12 having 10 taps, an FIR filter having 30 taps is required. However, as described in the [Problem that the Invention is to Solve] column, complicated processing is required to calculate a filter coefficient, and it is difficult to calculate the filter coefficient within a practical time, which is impractical.

(Method of this Embodiment)

In a field of digital signal processing, it is known that a product of transfer functions (frequency characteristics of impulse responses) is equivalent to a convolution integral. The inventor of the invention has solved the problem focusing on this point. Hereinafter, a specific description thereof will be given.

In FIG. 2, when a transfer function in the emphasis function is set to be $\Phi E(\omega)$, a transfer function in the channel emulator function is set to be $\Phi V(\omega)$, and a transfer function in the ISI function is set to be $\Phi I(\omega)$, the output signal y(n) is represented by [Expression 11].

$$y(n) = \varnothing_E * \varnothing_V * \varnothing_I * X_I \qquad \text{[Expression 11]}$$

When Fourier transform is performed on [Expression 11], [Expression 12] is obtained.

$$Y(\omega) = \Phi_E(\omega) \cdot \Phi_V(\omega) \cdot \Phi_I(\omega) \cdot X(\omega) \qquad \text{[Expression 12]}$$

Here, $$\Phi(\omega) = \Phi_E(\omega) \cdot \Phi_V(\omega) \cdot \Phi_I(\omega) \qquad \text{[Expression 13]}$$

is established.

As described above, a product of transfer functions (frequency characteristics of impulse responses) is equivalent to a convolution integral, and thus it is possible to obtain an impulse response $\varphi(n)$ by performing inverse Fourier transform on [Expression 13]. That is, the signal generation device in this embodiment can obtain the impulse response $\varphi(n)$ by simple calculation using a product of transfer functions without performing complicated calculation of a convolution integral, and thus it is possible to calculate a filter coefficient of the FIR filter 12 having a relatively large number of taps at high speed and to realize a plurality of functions.

Meanwhile, in [Expression 13], in a case where there is an unselected function from among the three functions, the transfer function thereof is set to 1. For example, in a case where the emphasis function is not selected, the transfer function thereof $\Phi E(\omega)$ is set to 1.

In addition, a frequency characteristic (transfer function) of the FIR filter 12 can be obtained as follows on the basis of [Expression 14]. Meanwhile, T denotes the number of pieces of data, and m denotes a numerical range from 0 to (T−1).

$$Z = e^{j2\pi m/T} \qquad \text{[Expression 14]}$$

The transfer function $\Phi E(\omega)$ in the emphasis function is obtained by substituting [Expression 14] for the right side of [Expression 3]. In addition, the transfer function $\Phi V(\omega)$ in the channel emulator function is obtained by substituting [Expression 14] for the right side of [Expression 5]. In addition, the transfer function $\Phi I(\omega)$ in the ISI function is obtained by substituting [Expression 14] for the right side of [Expression 8].

[Description of Configuration]

Next, a configuration in an embodiment of a signal generation device 10 according to the invention will be described.

Figure 3:
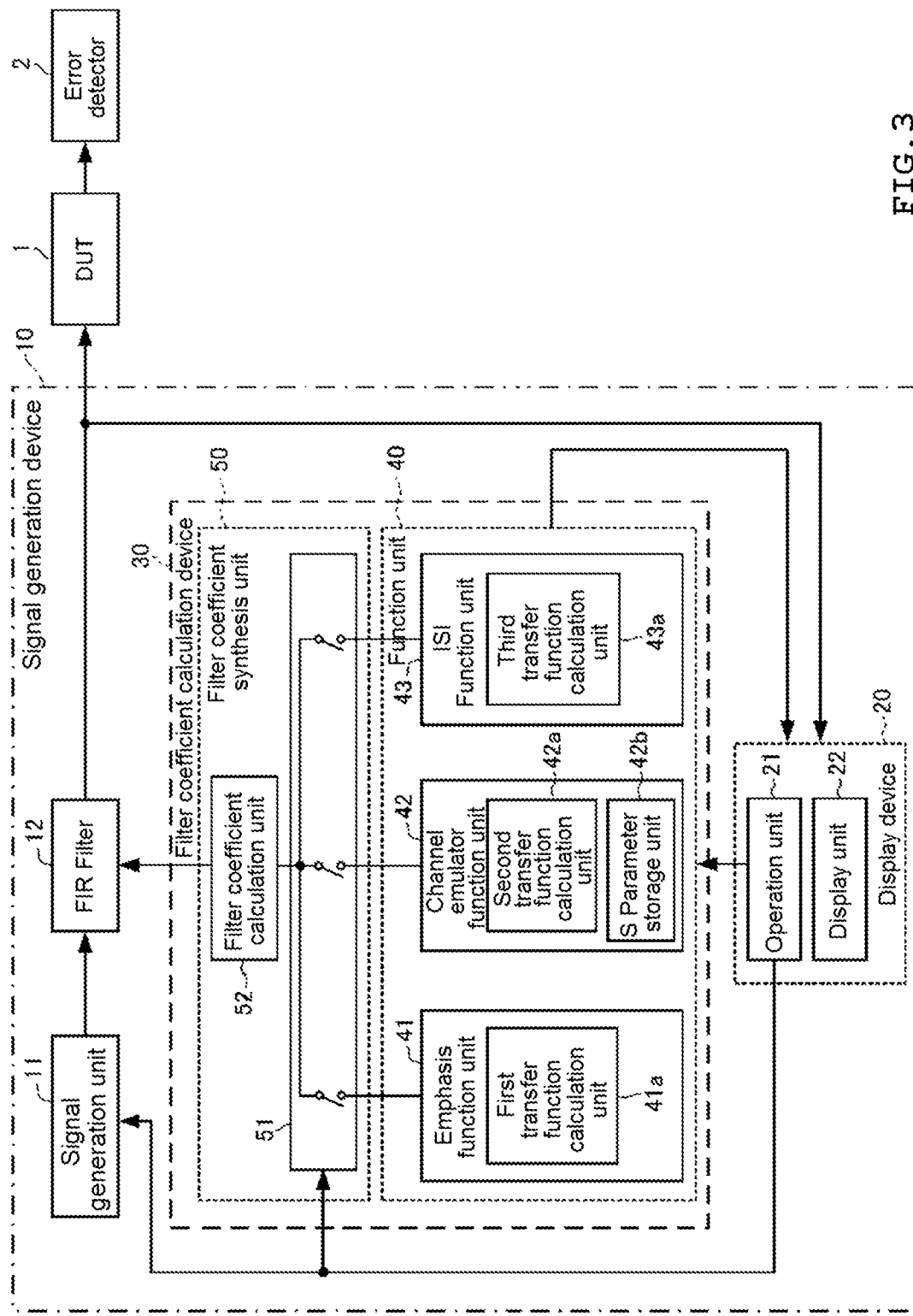
FIG. 3 is a functional configuration diagram of a signal generation device in the embodiment of the invention.

As described in FIG. 3, the signal generation device 10 in this embodiment includes a signal generation unit 11, the FIR filter 12, a display device 20, and a filter coefficient calculation device 30. The signal generation device 10 includes a microcomputer including a CPU, a ROM, a RAM, an input and output circuit to which various interfaces are connected, and the like. The signal generation device 10 causes the microcomputer to function as each function unit 40 of the signal generation device 10 by causing the ROM to execute a control program stored in advance.

A DUT 1 as a test target device is connected to the signal generation device 10, and an error detector 2 is connected to the DUT 1. The signal generation device 10 outputs an ultra high speed digital signal having a transmission speed of, for example, 30 Gbit/sec to the DUT 1 as a test signal, and the error detector 2 detects an error rate of the DUT 1 on the basis of the test signal from the signal generation device 10.

The signal generation unit 11 generates a digital signal of a pulse pattern based on a communication standard or any pulse pattern on the basis of a control signal received from an operation unit 21 (to be described later) of the display device 20, and outputs the generated digital signal to the FIR filter 12. The signal generation unit 11 is an example of signal generation means.

As illustrated in FIG. 1, the FIR filter 12 includes the delay device 12a, the multiplier 12b, and the adder 12c, and has 10 taps. A filter coefficient calculated by the filter coefficient calculation device 30 is set for the multiplier 12b of the FIR filter 12, and the FIR filter 12 performs predetermined processing on an input digital signal and outputs the processed signal to the DUT 1. Meanwhile, in this embodiment, the number of taps of the FIR filter 12 is set to 10, but the invention is not limited thereto.

The filter coefficient calculation device 30 includes the function unit 40 and a filter coefficient synthesis unit 50. The function unit 40 includes an emphasis function unit 41, a channel emulator function unit 42, and an ISI function unit 43. A signal indicating a function selected by a user and various parameters for executing functions are input to the function unit 40 from the operation unit 21. Meanwhile, in this embodiment, an example in which three functions are realized by one FIR filter 12 is described, but the invention is not limited to the realization of the three functions. In addition, the function unit 40 is an example of functional means.

The emphasis function unit 41 includes a first transfer function calculation unit 41a. The first transfer function calculation unit 41a calculates the transfer function $\Phi E(\omega)$ in the emphasis function on the basis of [Expression 3] and [Expression 14]. Meanwhile, the first transfer function calculation unit 41a is an example of transfer function calculation means.

The channel emulator function unit 42 includes a second transfer function calculation unit 42a and an S parameter (Scattering parameter) storage unit 42b.

The second transfer function calculation unit 42a calculates the transfer function $\Phi V(\omega)$ in the channel emulator function on the basis of [Expression 5] and [Expression 14]. Here, the second transfer function calculation unit 42a converts an S parameter of the DUT 1 which is stored in the S parameter storage unit 42b into the FIR filter 12 having 10 taps to calculate the transfer function $\Phi V(\omega)$. Meanwhile, the second transfer function calculation unit 42a is an example of transfer function calculation means.

The S parameter storage unit 42b stores the S parameter of the DUT 1 which is acquired in advance using, for example, a network analyzer.

The ISI function unit 43 includes a third transfer function calculation unit 43a. The third transfer function calculation unit 43a calculates the transfer function $\Phi I(\omega)$ in the ISI function on the basis of [Expression 8] and [Expression 14]. Meanwhile, the third transfer function calculation unit 43a is an example of transfer function calculation means.

The filter coefficient synthesis unit 50 includes a function selection unit 51 and a filter coefficient calculation unit 52.

The function selection unit 51 selects one or more functions from among the three functions and inputs the selected transfer function on the basis of a function selection signal (to be described later) from the operation unit 21, and thus the function selection unit 51 selects at least one from among the emphasis function unit 41, the channel emulator function unit 42, and the ISI function unit 43. The function selection unit 51 is an example of selection means.

The filter coefficient calculation unit 52 performs inverse Fourier transform on a transfer function in one function input by the function selection unit 51 or a product of transfer functions in a plurality of functions on the basis of [Expression 13] to obtain an impulse response of a finite impulse response filter, and calculates the impulse response as a filter coefficient. For example, in a case where a plurality of functions are selected by the operation unit 21, the filter coefficient calculation unit 52 calculates a filter coefficient obtained by synthesizing the functions. In addition, the filter coefficient calculation unit 52 sets the calculated filter coefficient in the FIR filter 12. Meanwhile, the filter coefficient calculation unit 52 is an example of filter coefficient calculation means.

The display device 20 includes the operation unit 21 which includes, for example, a touch panel and outputs an operation signal in accordance with a user's touch operation, and a display unit 22 which is disposed so as to overlap the operation unit 21 and includes a liquid crystal display.

The operation unit 21 is operated by the user and inputs various parameters for executing functions of the function unit 40. In addition, the operation unit 21 detects a selection operation for causing the user to select one or a plurality of functions from among the three functions, and outputs a function selection signal. Further, the operation unit 21 instructs the signal generation unit 11 to generate a signal.

The display unit 22 includes a display control circuit and displays a predetermined image. In addition, the display unit 22 can display a setting state of one or a plurality of functions selected by the operation unit 21 on the basis of the function selection signal output from the operation unit 21. Further, the display unit 22 is configured to be capable of monitoring an output signal of the FIR filter 12 on the basis of a control signal received from the operation unit 21.

Figure 4:
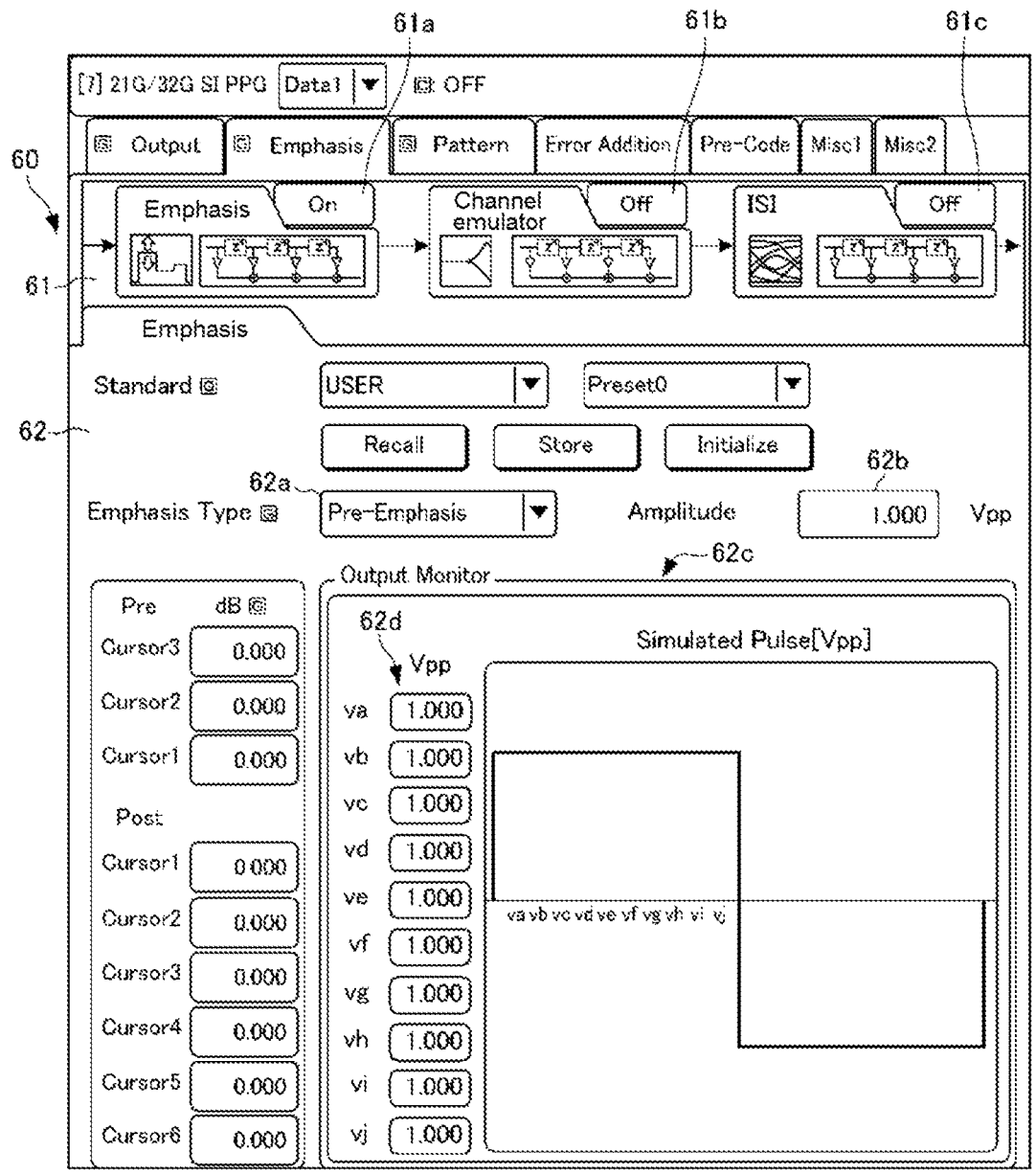
FIG. 4 is a diagram illustrating an emphasis function screen in the embodiment of the invention.
Figure 5:
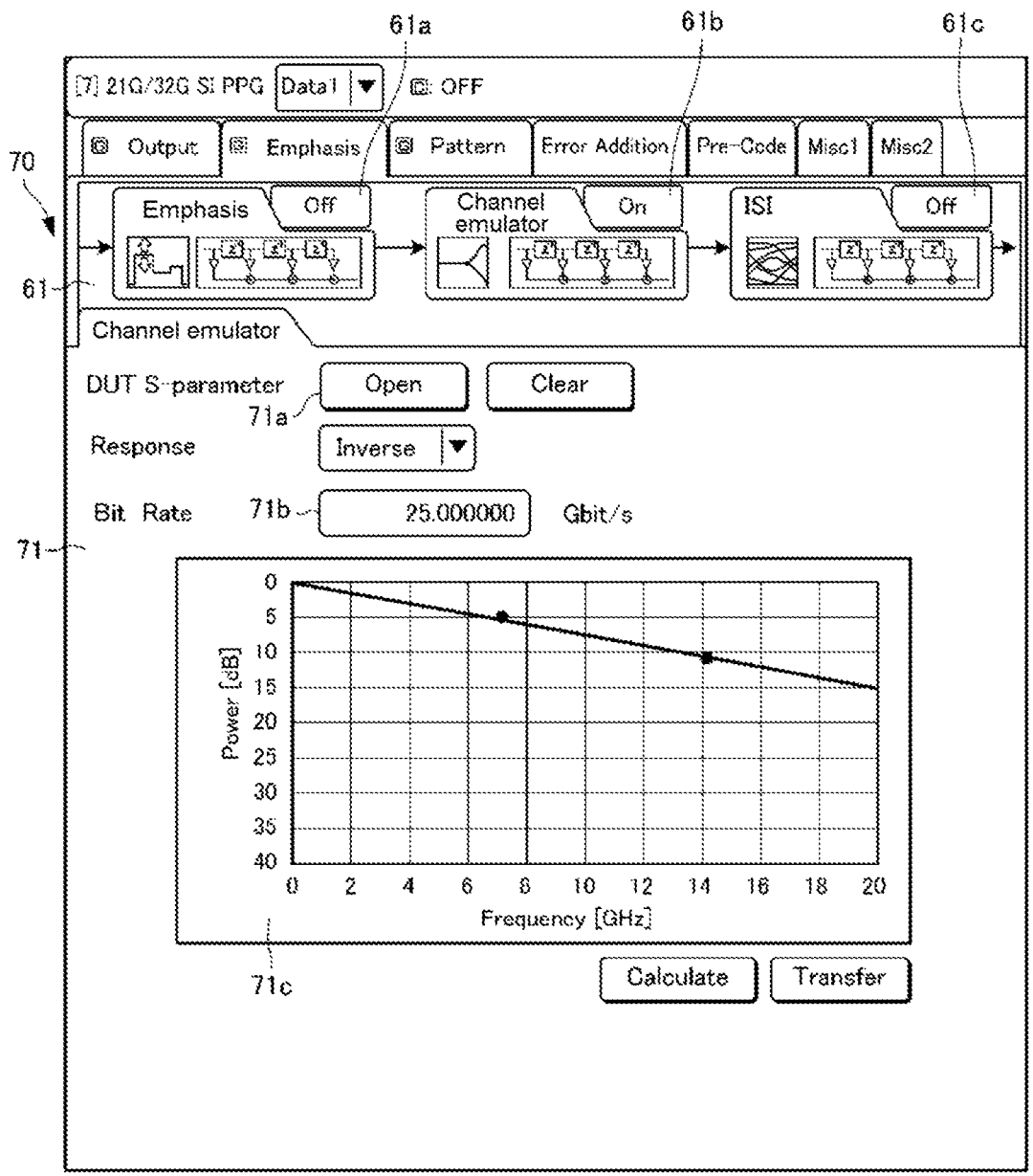
FIG. 5 is a diagram illustrating a channel emulator function in the embodiment of the invention.
Figure 6:
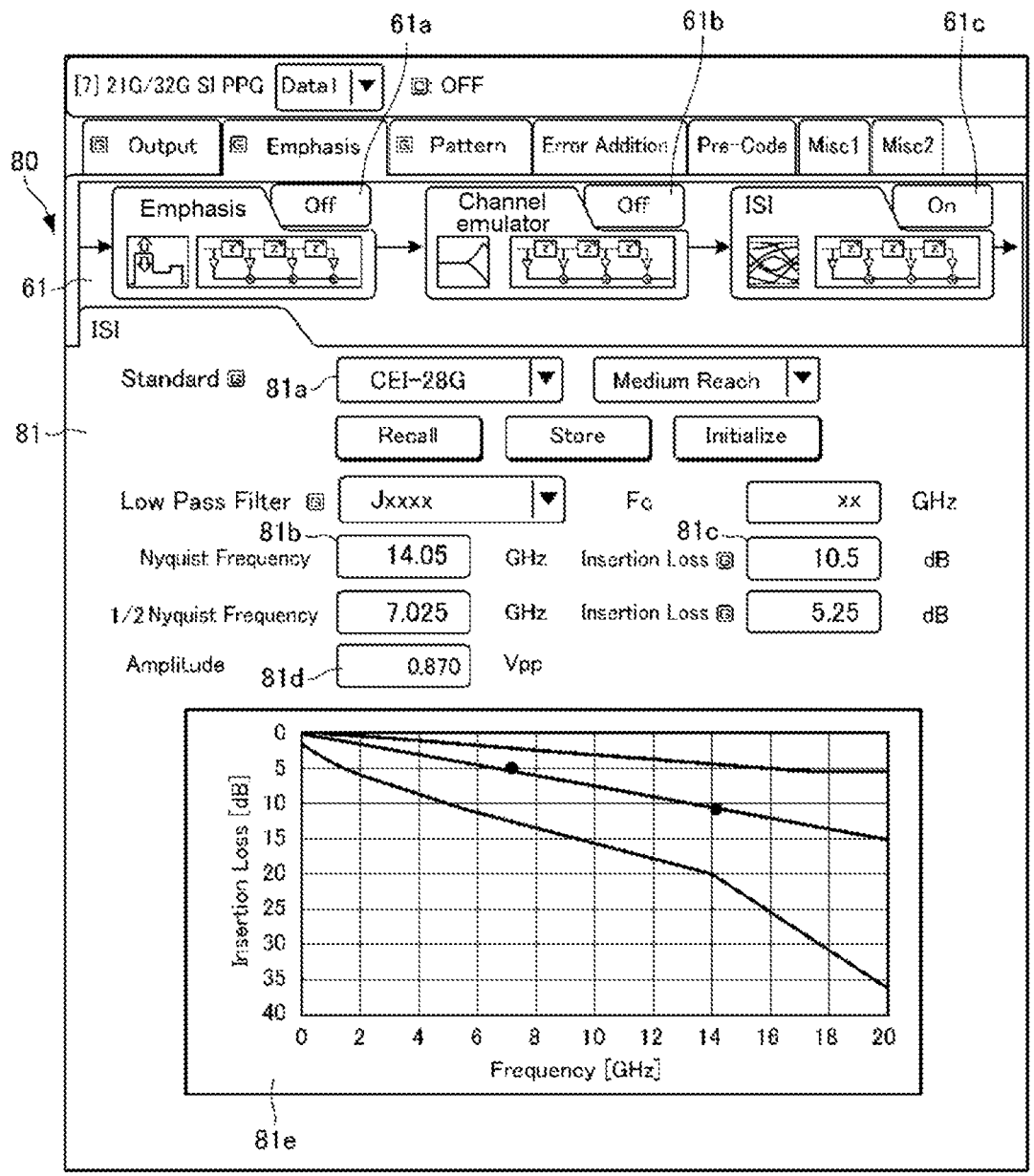
FIG. 6 is a diagram illustrating an ISI function screen in the embodiment of the invention.

An example of the function of the display unit 22 will be described with reference to FIGS. 4 to 6. FIGS. 4 to 6 respectively illustrate display screens of the display unit 22 in a case where an emphasis function, a channel emulator function, and an ISI function are selected.

FIG. 4 illustrates an example of an emphasis function screen 60. The emphasis function screen 60 is provided with a function display region 61 schematically showing configurations and selected states of functions, and a setting state display region 62 showing a setting state of the emphasis function.

The signal generation device 10 can cause a user to intuitively ascertain that there are three functions of the emphasis function, the channel emulator function, and the ISI function as functions incorporated into the signal generation device 10 by providing the function display region 61 in the emphasis function screen 60, and it is possible to synthesize any functions by touching selection buttons 61a to 61c. In the example illustrated in FIG. 4, the selection button 61a is turned on by the user, and the emphasis function is selected.

In addition, the setting state display region 62 is provided with a form setting portion 62a for setting any one form of pre-emphasis or de-emphasis in the emphasis function, and an amplitude setting portion 62b for setting an amplitude of a signal. Further, the setting state display region 62 is provided with an output monitoring region 62c. In the output monitoring region 62c, an emphasis function based on 10 taps can be set by the voltage setting portion 62d of va to vj, and a waveform set by the voltage setting portion 62d can be monitored. Meanwhile, the selection buttons 61a to 61c, the form setting portion 62a, the amplitude setting portion 62b, the voltage setting portion 62d, and the like illustrated in FIG. 4 are examples of the operation unit 21.

Similarly to FIG. 4, FIG. 5 illustrates an example of a channel emulator function screen 70. The channel emulator function screen 70 is provided with a function display region 61 schematically showing configurations and selected states of functions, and a setting state display region 71 showing a setting state of a channel emulator function. In the example illustrated in FIG. 5, a selection button 61b is turned on by a user in the function display region 61, and the channel emulator function is selected.

The setting state display region 71 is provided with a file open button 71a for opening a file of the S parameter of the DUT 1 which is stored in advance in order to realize the channel emulator function. In addition, the setting state display region 71 is provided with a bit rate setting portion 71b for setting a bit rate, and a graph display region 71c for displaying a graph indicating a relationship between a frequency and power. Meanwhile, the file open button 71a, the bit rate setting portion 71b, and the like illustrated in FIG. 5 are examples of the operation unit 21.

FIG. 6 illustrates an example of an ISI function screen 80. Similarly to FIG. 4, the ISI function screen 80 is provided with a function display region 61 schematically showing configurations and selected states of functions, and a setting state display region 81 showing a setting state of an ISI function. In the example illustrated in FIG. 6, a selection button 61c is turned on by a user in the function display region 61, and the ISI function is selected.

The setting state display region 81 is provided with a test standard setting portion 81a for setting a test standard to be applied, a Nyquist frequency setting portion 81b for setting a Nyquist frequency, an insertion loss setting portion 81c for setting an insertion loss, an amplitude setting portion 81d for setting an amplitude, a graph display region 81e for displaying a graph indicating a relationship between a frequency and an insertion loss, and the like. Meanwhile, the test standard setting portion 81a, the Nyquist frequency setting portion 81b, the insertion loss setting portion 81c, the amplitude setting portion 81d, and the like illustrated in FIG. 6 are examples of the operation unit 21.

[Description of Operation]

Figure 7:
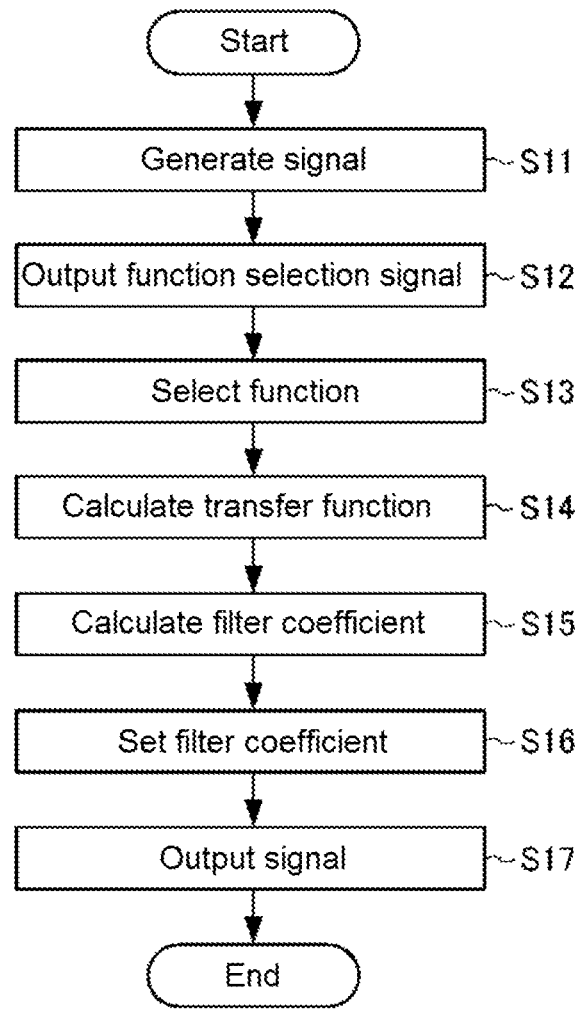
FIG. 7 is a flowchart of the signal generation device in the embodiment of the invention.

Next, the operation of the signal generation device 10 in this embodiment will be described with reference to FIG. 7. FIG. 7 is a flowchart illustrating a filter coefficient calculation method and a signal generation method in this embodiment.

The signal generation unit 11 generates a predetermined signal on the basis of a control signal received from the operation unit 21 of the display device 20 (step S11), and outputs the generated signal to the FIR filter 12.

The operation unit 21 outputs a function selection signal indicating one or a plurality of functions selected by a user's operation to the function unit 40 and the function selection unit 51 of the filter coefficient synthesis unit 50 (step S12).

The function selection unit 51 selects one or a plurality of functions from among three functions on the basis of the function selection signal output from the operation unit 21 (step S13).

The function unit 40 selects a transfer function of the FIR filter 12 in one or a plurality of functions selected in step S13 (step S14). Specifically, for example, in a case where an emphasis function and an ISI function are selected in step S13, the emphasis function unit 41 calculates a transfer function $\Phi E(\omega)$ on the basis of [Expression 3] and [Expression 14], and the ISI function unit 43 calculates a transfer function $\Phi I(\omega)$ on the basis of [Expression 8] and [Expression 14].

The filter coefficient calculation unit 52 calculates a filter coefficient in one or a plurality of functions selected in step S13 (step S15). Specifically, the filter coefficient calculation unit 52 performs inverse Fourier transform on a transfer function in one function or a product of transfer functions in a plurality of functions selected in step S13 to obtain an impulse response of the FIR filter 12, and calculates the impulse response as a filter coefficient.

For example, in a case where the emphasis function and the ISI function are selected in step S13, the filter coefficient calculation unit 52 performs inverse Fourier transform on a product of $\Phi V(\omega)$ and $\Phi I(\omega)$ to obtain an impulse response of the FIR filter 12 as a transfer function $\Phi V(\omega)=1$ in a channel emulator function which is not selected, and calculates the impulse response as a filter coefficient.

The filter coefficient calculation unit 52 sets the calculated filter coefficient in the FIR filter 12 (step S16).

The FIR filter 12 inputs the signal generated in step S11, performs predetermined processing (processing for adding a selected function) on the signal, and outputs the processed signal to the DUT 1 (step S17).

As described above, the filter coefficient calculation device 30 in this embodiment can perform inverse Fourier transform on a transfer function in one function selected by the function selection unit 51 or a product of transfer functions in a plurality of functions selected by the function selection unit 51 to obtain an impulse response of the FIR filter 12, and can calculate the impulse response as a filter coefficient.

That is, the filter coefficient calculation device 30 in this embodiment does not require complicated processing to calculate a filter coefficient, and can realize a plurality of functions by one FIR filter 12.

Therefore, the filter coefficient calculation device 30 in this embodiment can calculate a filter coefficient of the FIR filter 12 having a relatively large number of taps at high speed and can realize a plurality of functions.

In addition, the signal generation device 10 in this embodiment includes the filter coefficient calculation device 30, and thus it is possible to calculate a filter coefficient of the FIR filter 12 having a relatively large number of taps at high speed and to realize a plurality of functions.

As described above, the filter coefficient calculation device, the signal generation device including the filter coefficient calculation device, the filter coefficient calculation method, and the signal generation method according to the invention are useful as a filter coefficient calculation device having an effect of making it possible to calculate a filter coefficient of an FIR filter having a relatively large number of taps at high speed and realize a plurality of functions and calculating a filter coefficient of a finite impulse response filter, a signal generation device including the filter coefficient calculation device, a filter coefficient calculation method, and a signal generation method.

DESCRIPTION OF REFERENCE NUMERALS AND SIGNS

1 DUT (test target device)
2 Error detector
10 Signal generation device
11 Signal generation unit (signal generation means)
2 FIR filter (finite impulse response filter)
20 Display device
21 Operation unit
22 Display unit
30 Filter coefficient calculation device
40 Function unit (functional means)
41 Emphasis function unit
41a First transfer function calculation unit (transfer function calculation means)
42 Channel emulator function unit
42a Second transfer function calculation unit (transfer function calculation means)
42b S parameter storage unit
43 ISI function unit (intersymbol interference functional means)
43a Third transfer function calculation unit (transfer function calculation means)
50 Filter coefficient synthesis unit
51 Function selection unit (selection means)
52 Filter coefficient calculation unit (filter coefficient calculation means)
60 Emphasis function selection screen
70 Channel emulator function selection screen
80 ISI function selection screen

What is claimed is:

1. A signal generation device comprising:
a signal generator configured to generate a signal for testing a test target device; and
a finite impulse response filter comprising a number of taps, and which has a plurality of predetermined functions executable by the finite impulse response filter depending on one or more filter coefficients corresponding to the number of taps, configured to:
set the one or more filter coefficients in the finite impulse response filter,
receive the signal from the signal generator,
perform one or more functions of the plurality of predetermined functions on the signal to generate a processed signal, and
output the processed signal to the test target device;
at least one processor configured to:
calculate a plurality of transfer functions of the finite impulse response filter, each of the plurality of transfer functions corresponding to one of the plurality of predetermined functions of the finite impulse response filter; and
a selector configured to:
receive each of the plurality of transfer functions as inputs, and
select any combination of the plurality of transfer functions;
wherein the processor is further configured to calculate a product of the selected transfer functions, and
to perform an inverse Fourier transform on the product of the selected transfer functions to obtain an impulse response of the finite impulse response filter as the one or more filter coefficients.

2. The signal generation device according to claim 1, wherein the at least one processor is further configured to:
add an emphasis function to the signal generated by the signal generator,
add a function of simulating a channel through which the signal passes to the signal output to the test target device, or
add a function of exerting influence of intersymbol interference on the signal output to the test target device.

3. The signal generation device according to claim 2, wherein the at least one processor is configured to add the function of simulating the channel on the basis of scattering parameters of the test target device.

4. The signal generation device according to any one of claim 1, further comprising:
a display device configured to:
detect a selection operation of a user selecting one or more of the plurality of functions, and
output a signal indicating the selected one or more of the plurality of functions to the at least one processor.

5. The signal generation device according to claim 4, wherein the display device includes a display configured to display a setting state of the selected one or more of the plurality of functions.

6. A signal generation method comprising:
a filter coefficient calculation step for a finite impulse response filter comprising a number of taps that has a plurality of predetermined functions executable by the finite impulse response filter depending on one or more filter coefficients corresponding to the number of taps;
a signal generation step of generating a signal by a signal generator for testing a test target device;
a filter coefficient setting step of setting the one or more filter coefficients calculated by the filter coefficient calculation step in the finite impulse response filter; and
a signal output step of receiving the signal from the signal generator and causing the finite impulse response filter to perform the predetermined function or functions on the signal to generate and output a processed signal to the test target device,
wherein the filter coefficient calculation step comprises:
a transfer function calculation step of calculating a plurality of transfer functions, each of the plurality of the transfer functions corresponds to each of the plurality of the predetermined functions of the finite impulse response filter;
a selection step of receiving each of the plurality of transfer functions as inputs to a selector, and selecting any combination of the plurality of the transfer functions; and
a filter coefficient calculation step of calculating a product of the selected transfer functions and performing inverse Fourier transform on the product of the selected transfer functions to obtain an impulse response of the finite impulse response filter as the one or more filter coefficients.

7. The signal generation method according to claim 6, further comprising at least one of:
an emphasis function step of adding emphasis function to the signal;
a channel emulator function step of adding a function of simulating a channel through which the signal passes to the signal output to the test target device; or
an intersymbol interference function step of adding a function of exerting influence of intersymbol interference on the signal output to the test target device.

8. The signal generation method according to claim 7, wherein the channel emulator function step adds the function of simulating the channel on the basis of scattering parameters of the test target device.

9. The signal generation method according to any one of claim 6, further comprising:
a display step of detecting a selection operation of causing a user to select one or the plurality of functions to display the detected selection operation,
wherein a signal indicating one or the plurality of functions selected by the selection operation of the user is output to the selection step.

10. The signal generation method according to claim 9, wherein the display step displays a setting state of one or the plurality of functions selected by the selection operation of the user.

* * * * *